United States Patent [19]
Shen et al.

[11] Patent Number: 5,579,331
[45] Date of Patent: Nov. 26, 1996

[54] DELTA-STRAINED QUANTUM-WELL SEMICONDUCTOR LASERS AND OPTICAL AMPLIFIERS

[75] Inventors: Paul H. Shen, Howell; Paul W. Cooke, Hazlet; Wayne H. Chang, Princeton Junction, all of N.J.

[73] Assignee: The United States of America as represented by the Secretary of the Army, Washington, D.C.

[21] Appl. No.: 455,584

[22] Filed: May 31, 1995

[51] Int. Cl.$^6$ ................................................. H01S 3/18
[52] U.S. Cl. ................................................................ 372/45
[58] Field of Search ................................. 372/45; 257/18

[56] References Cited

U.S. PATENT DOCUMENTS

| | | | |
|---|---|---|---|
| 5,172,384 | 12/1992 | Goronkin et al. | 372/45 |
| 5,274,247 | 12/1993 | Dutta et al. | 257/17 |
| 5,381,260 | 1/1995 | Dutta et al. | 359/248 |

OTHER PUBLICATIONS

Ahn et al, "The Theory of Strained–Layer Quantum–Well Lasers with Bandgap Renormalization", vol. 30, No. 2, Feb. 1994, pp. 350–365.

Yang, L., "A New InGaAs/InGaAsP delta–Strained Multiple–Quantum–Well Laser Grown by Chemical Beam Epitaxy", IEEE Phot. Tech. Lett., vol. 3, No. 5, May 1991, pp. 430–432.

Primary Examiner—Rodney B. Bovernick
Assistant Examiner—Robert McNutt
Attorney, Agent, or Firm—Michael Zelenka; William H. Anderson

[57] ABSTRACT

A quantum-well semiconductor laser/amplifier mounted on a highly conductive semiconductor substrate. Inactive regions include a highly doped N-region and a highly doped P-region. The N-region is composed of semiconductor material mounted on the substrate. The active region includes a quantum-well heterostructure of intrinsic semiconductor material that mounts on the N-region. The quantum-well structure includes a series of quantum wells, each having barrier layers, quantum-well layers, and a delta-strained layer mounted near the center of the quantum wells. The delta-strained layers are very thin, being formed from a number of mono-layers of semiconductor material. There is a large lattice mismatch between each of the delta-strained layers and its adjacent quantum-well layers. The band edges of the quantum-well layers and the delta-strained layers are located at substantially the same level. The P-region is composed of a semiconductor material that mounts on the quantum-well structure. A conductive contact is joined to the P-region. When used as a semiconductor laser, the active region forms a resonant laser cavity.

10 Claims, 3 Drawing Sheets

DELTA STRAIN

UNIFORM STRAIN

DELTA-STRAINED QUANTUM-WELL SEMICONDUCTOR LASERS AND OPTICAL AMPLIFIERS

GOVERNMENT INTEREST

The invention described herein may be manufactured, used and licensed by or for the Government for governmental purposes without the payment to us of any royalties thereon.

BACKGROUND OF THE INVENTION

1. Field of the Invention

This invention relates in general to the field of semiconductor devices. More particularly, the invention relates to quantum-well semiconductor lasers and optical amplifiers.

2. Description of the Prior Art

Semiconductor lasers emit optical radiation in a highly directional beam as do solid-state lasers and gas lasers. However, the semiconductor laser differs from other lasers in that it is small and is easily modulated at high frequencies simply by modulating the biasing current. A semiconductor optical amplifier is a device that closely resembles a semiconductor laser. The semiconductor optical amplifier, which does not have a resonant cavity, uses its biasing current to amplify appropriately directed light incident on its active region.

Because of their small size and unique performance characteristics, the semiconductor laser and optical amplifier have found widespread use in many fields. One of the most important uses of the semiconductor laser is as a light source for optical-fiber communication. Also, semiconductor lasers and optical amplifiers have significant applications in video recording, optical signal processing, high-speed printing, and optical scanning, reading and display devices.

One common type of semiconductor laser/amplifier comprises a quantum-well heterostructure of intrinsic semiconductor material sandwiched between a highly doped P-region and a highly doped N-region. Light is emitted from the region that contains the quantum-well heterostructure, and, as such, that region is referred to as the active region. The P- and N-regions, which are called inactive regions, provide suitable carriers to the active region and act as a waveguide for the light. As is well known by those skilled in these arts, these regions can be fabricated by conventional epitaxial crystal growth techniques using, for example, III–V compound alloy systems to form the semiconductor layers. In general, these structures are referred to as PIN diode lasers/amplifiers.

To achieve heterostructures with negligible interface traps, the lattices between the different semiconductor layers must be matched closely. Large lattice mismatches usually result in the formation of lattice defects such as dislocations that degrade device performance. It has been recognized, however, that moderate mismatches that produce coherently strained layers free of dislocations can be beneficial for semiconductor laser/amplifier performance as opposed to devices without strain. Specifically, the modified band structure of strained quantum-wells often lead to significant benefits for diode laser performance, including reduced threshold current density, improved efficiency and temperature insensitivity, and enhanced dynamic response and high-speed performance. As such strained lasers and optical amplifiers are commonly available at a wide range of wavelengths. Doyeol Ahn and Shun Lien Chuang describe a theoretical model for such devices in their publication entitled "The Theory of Strained-Layer Quantum-Well Lasers with Bandgap Renormalization," *IEEE Journal of Quantum Electronics*, Vol. 30, No. 2, February 1994, pp 350–365.

Obtaining maximum strain through lattice mismatching without inducing dislocations can be a critical problem for semiconductor engineers. The formation of dislocations is generally a function of layer thickness and the degree of mismatch. Specifically, for a given mismatch there is a critical layer thickness above which dislocations will form. The critical layer thickness constraint normally limits the maximum strain in a practical quantum-well layer to about one percent. Beyond that one-percent strain limit, substantial dislocations form. Attempts to increase strain beyond the one percent value and avoid dislocations by reducing layer thickness typically result in producing a quantum well that is to thin to have practical applications.

Consequently, those concerned with the development of strained-layered quantum-well semiconductor lasers and optical amplifiers have long sought techniques for obtaining enhanced performance by exploiting the beneficial effects of increased strain. When engineering such devices, however, designers have encountered considerable difficulty in avoiding the formation of lattice dislocations when attempting to increase strain by increasing the degree of lattice mismatch. As mentioned above, the critical layer thickness constraint normally limits the maximum strain in a practical quantum-well layer to about one percent. The present invention mitigates the problems associated with this limitation.

SUMMARY OF THE INVENTION

It is therefore an object of the present invention to provide a delta-strained quantum-well heterostructure in semiconductor lasers and optical amplifiers that effectively increases strain without forming dislocations, thereby gaining enhanced device performance.

To attain this, the present invention contemplates a unique semiconductor device having a quantum well with a narrow, highly mismatched layer located near its center. In general, the present invention includes highly doped N- and P-regions of semiconductor material. A quantum-well heterostructure is sandwiched between the N- and P-regions. The quantum-well heterostructure includes barrier layers located on either side of quantum-well layers that sandwich a delta-strained layer. A large lattice mismatch exists between the delta-strained layer and its adjacent quantum-well layers. Band edges of the quantum-well layers and delta-strained layers are engineered such that one or either hole band and the conduction bands align.

More specifically, the invention is directed to a quantum-well semiconductor laser/amplifier mounted on a highly conductive semiconductor substrate. A highly doped N-region of semiconductor material mounts on the substrate. A quantum-well heterostructure mounts on the N-region and includes a first barrier layer, a first quantum-well layer, a delta-strained layer, a second quantum-well layer and a second barrier layer successively joined to each other. The first and second barrier layers form potential barriers for a quantum well made up of the quantum-well layers and the delta-strained layer. There is a large lattice mismatch between the delta-strained layer and the first and second quantum-well layers to produce increased strain therein. The conduction band edges of the first and second quantum-well layers and the delta-strained layer are located at substantially the same level. Further, the valance band edges of the first and second quantum-well layers and the heavy-hole band edge of the delta-strained layer are located at substantially the same level. A highly doped P-region of semiconductor material mounts on the quantum-well heterostructure while a conductive contact is joined to the highly doped P-region. The quantum-well layers have substantially the same thickness so that the delta-strained layer is located substantially at the center of the quantum well.

BRIEF DESCRIPTION OF THE DRAWINGS

Other objects, features, details, advantages and applications of the invention will become apparent in light of the ensuing detailed disclosure, and particularly in light of the drawings wherein.

DETAILED DESCRIPTION OF THE PREFERRED EMBODIMENT

Figure 1:
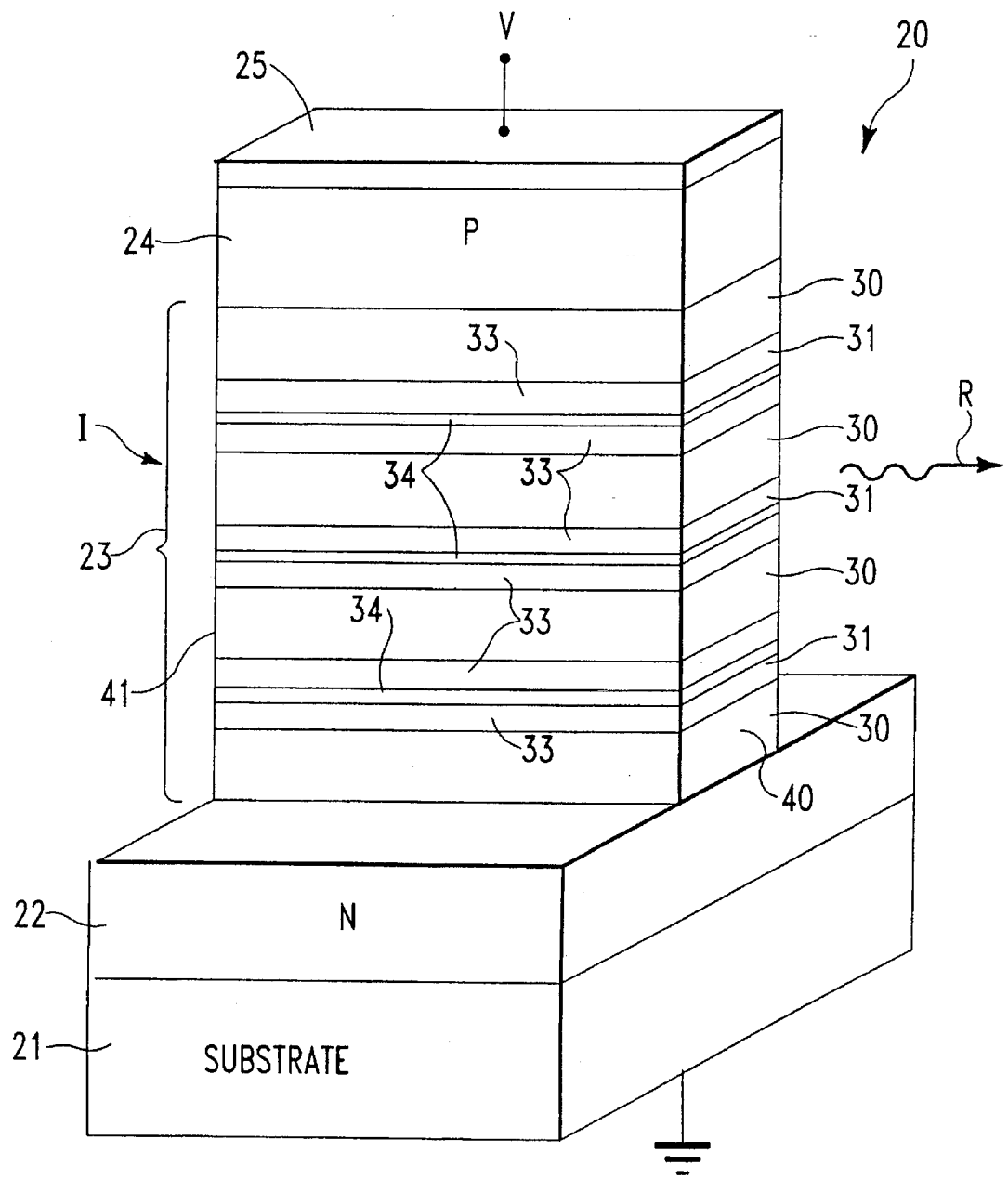
FIG. 1 is a schematic elevation, not to scale, of a preferred semiconductor device in accordance with the present invention.

Referring now to the drawings, FIG. 1 shows a schematic illustration (not to scale) of delta-strained quantum-well semiconductor laser 20 in accordance with the present invention. Delta-strained quantum-well semiconductor laser 20 includes highly conductive semiconductor substrate 21 with highly doped semiconductor N-layer 22 mounted thereon. Quantum-well structure 23 mounts on the upper surface of N-layer 22. Next highly doped semiconductor P-layer 24 is stacked on top of quantum-well structure 23. Finally, conductive contact 25 is located on the upper surface of P-layer 24. Biasing voltage V connects to contact 25 while substrate 21 connects to ground.

In a well known manner, broad vertical surfaces 40 and 41 on the opposed faces of quantum-well structure 23 are appropriately polished and finished to form the parallel reflectors of a resonant cavity that supports laser operation. For example, surface 40 may be partly reflective and partly transmissive while surface 41 is totally reflective. The other faces of quantum-well structure 23 are normally roughened to prevent the escape of laser radiation therefrom. When properly biased with voltage V, laser 20 emits laser radiation R from broad surface 40.

Quantum-well structure 23 comprises a heterostructure of intrinsic semiconductor materials made up of barrier layers 30 and quantum wells 31. Each quantum well 31 comprises three layers, namely, two quantum-well layers 33 of the same semiconductor material sandwiching a third, delta-strained layer 34 composed of a semiconductor material different from that found in layers 33. Delta-strained layers 34 are relatively thin layers of intrinsic semiconductor material having a lattice that is highly mismatched to the lattice of their adjacent quantum-well layers 33. Consequently, each delta-strained layer 34 provides a narrow region of high mismatch resulting in an abrupt, relatively high pulse-type strain, similar to a delta function, near the center of quantum well 31. Preferably, delta-strained layers 34 are placed in quantum wells 31 where they are most effective, i.e., where the population probability of carriers is large.

Because the thickness of delta-strained layer 34 is relatively small (a few mono-layers thick), higher lattice mismatches can be employed. While still maintaining well width, these higher mismatches can introduce significant strains within quantum well 31 without risking the formation of dislocations. As explained above, these increased strains in the quantum-well layers can result in improved device performance.

Suitable materials for fabricating substrate 21 include gallium arsenide (GaAs) and indium phosphide (InP). When substrate 21 is composed of GaAs, the composition of N-layer 22 would preferably be silicon- (Si) doped $Al_xGa_{1-x}As$, P-layer 24 would be beryllium- (Be) doped $Al_xGa_{1-x}As$ and contact layer 25 would be Be-doped GaAs. Layers 30, 33 and 34 would be composed of intrinsic semiconductor materials to essentially form an intrinsic region of a PIN diode structure. The composition of barrier layers 30 would preferably be $Al_yGa_{1-y}As$ while that of quantum well layers 33 would be GaAs or $In_zGa_{1-z}As$. Finally, delta-strained layers 34 would each be formed from a few monolayers of highly strained $In_wAl_{1-w}As$.

When substrate 21 is composed of InP, the composition of N-layer 22 would preferably be Si-doped InP, P-layer 24 would be Be-doped InP and contact layer 25 would be an alloy of Be-doped InGaAs. For the intrinsic semiconductor region of this example, barrier layers 30 would be composed of an alloy of InGaAsP, quantum-well layers 33 would be composed of an alloy of InGaAs, and delta-strained layers 34 would be composed of a few mono-layers of an alloy of InAlAs, GaSb, InGaAs or InAlSb.

The above materials are only examples and it will be evident to those skilled in these arts that delta-strained quantum-well semiconductor laser 20 can be fabricated by conventional epitaxial crystal growth techniques using a wide variety of III–V or II–VI alloy laser emitters. Also the present description illustratively shows quantum-well structure 23 as having a pattern of barriers and quantum wells that is repeated three times. Of course, quantum-well structure 23 may be implemented with patterns that are repeated from one to hundreds of times depending on the particular application.

Typical layer thicknesses for the preferred embodiment are as follows: doped layers 22 and 24 would be in the order of one micron, barrier layers 30 would be about 0.1 micron while quantum well layers 33 would be about 0.006 micron. Since its thickness would depend on the number of monolayers deposited, each delta-strained layer 34 would be in the order of a few angstroms thick (e.g., 3 to 20 angstroms).

Figure 2:
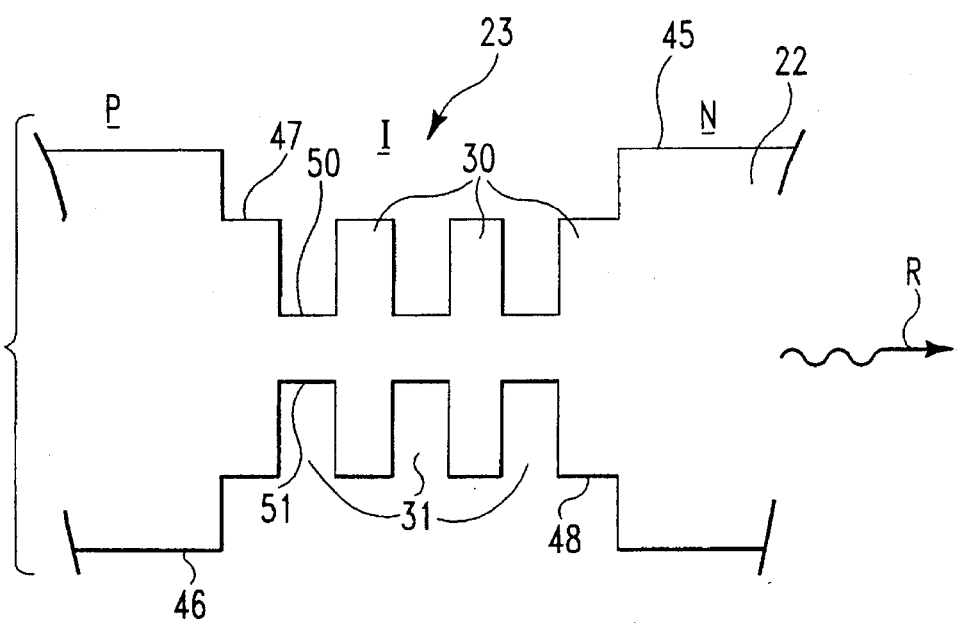
FIG. 2 is an energy band diagram for the semiconductor structure of FIG. 1.

FIG. 2 depicts a conventional energy band diagram for delta-strained quantum-well semiconductor laser 20 in the forward bias condition. Quantum-well structure 23, which extends between P-layer 24 and N-layer 22, has barrier layers 30 with a conduction band edge 47 and valance band edge 48. Quantum wells 31 are located between barrier layers 30 and have conduction band edges 50 and valance band edges 51.

As is well known, stimulated emission of radiation for laser operation is generally produced by applying a sufficiently high forward biasing voltage to cause population inversion. This condition is depicted in the band diagram of FIG. 2. With forward bias voltage V applied to laser 20 (see FIG. 1), electrons are injected from N-layer 22 and holes are injected from P-layer 24 into quantum-well structure 23 such that sufficiently high concentrations of these carriers occupy allowed states in quantum wells 31 to achieve population inversion. Band-to-band transitions result in laser radiation being produced in the resonant cavity defined by surfaces 40 and 41, thereby causing radiation R to be emitted from surface 40 (see FIG. 1).

Figure 3A:
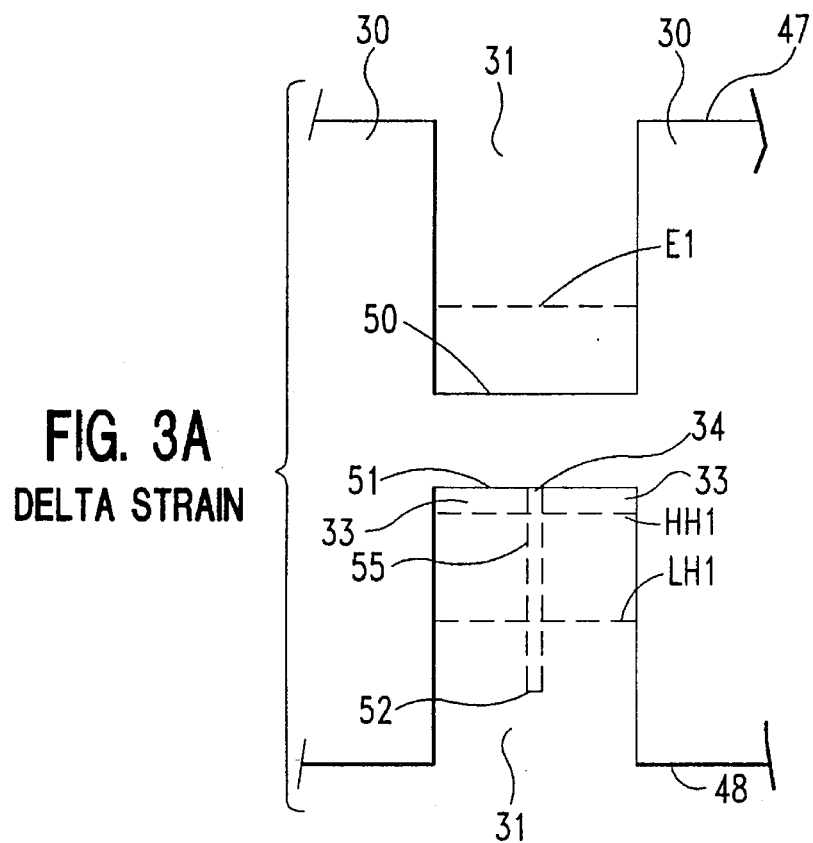
FIG. 3A is an energy band diagram showing an enlarged view of a portion of the energy band diagram of FIG. 2.

FIG. 3A illustrates a more detailed band diagram of one of quantum wells 31 and its adjacent barrier layers 30 as seen in their forward biased state as depicted in FIG. 2. In FIG. 3A, the conduction band of quantum well 31 includes first allowed energy state E1, and the valance band includes first allowed heavy-hole (HH) energy state HH1 and first allowed light-hole (LH) energy state LH1. The band diagram of FIG. 3A depicts the location of delta-strained layer 34 with respect to quantum-well layers 33 with vertical dashed lines 55 that extend from valance band edge 51. This specific example represents a compressed delta-strained layer.

As further seen in the FIG. 3A band diagram, delta-strained layer 34 is engineered so that its conduction band edge lies at substantially the same level as conduction band edge 50 of quantum-well layers 33. Still further, the band diagram shows the HH valance band edge and the LH valance band edge in the regions outside the delta-strained region that is defined by vertical lines 55 to be located at substantially the same level, i.e., at valance band edge 51. However, the HH and LH valance band edges in the delta-strained region are split and not located at the same level. Specifically, LH valance band edge 52 in delta-strained layer 34 is shown to extend well below LH energy level LH1, while HH valance band edge remains at valance band edge 51. A similar situation could be engineered for a tensile delta-strained layer with the resulting interchange of energy levels LH1 and HH1 in FIG. 3A.

Figure 3B:
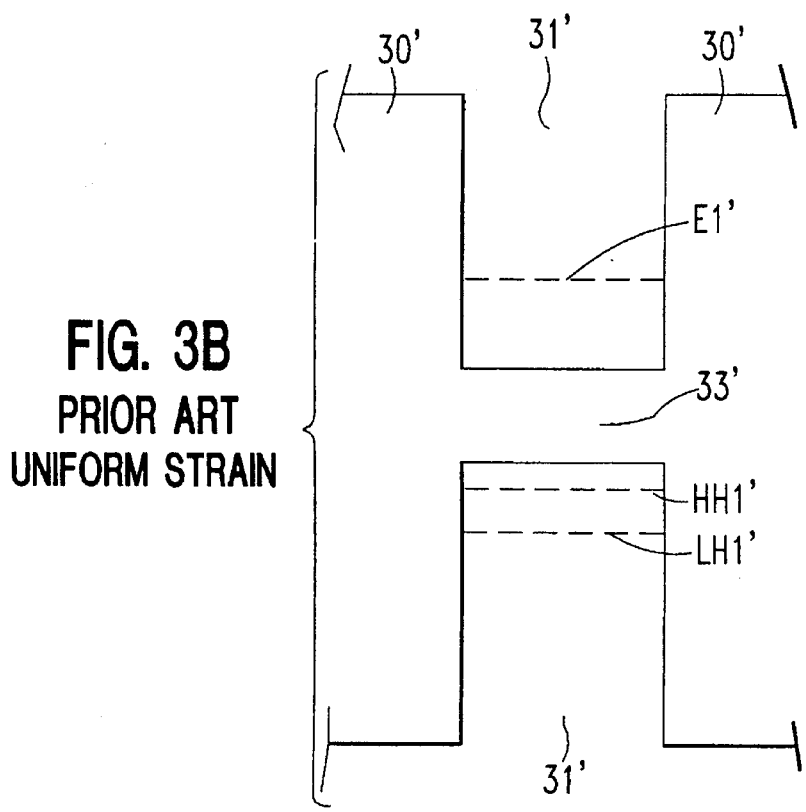
FIG. 3B is an energy band diagram for a prior art semiconductor structure with a uniformly strained quantum well for use in comparison with the energy band diagram of FIG. 3A.

For comparison purposes, FIG. 3B depicts a band diagram similar to that of FIG. 3A but for a prior art strained-layer quantum-well laser. More specifically, FIG. 3B shows strained-layer quantum well 31' having a width comparable to that of delta-strained quantum well 31 of FIG. 3A. Quantum well 31' includes a quantum-well layer 33' having a lattice that is mismatched with respect to that of its barrier layers 30' to produce a uniformly compressively strained quantum well. Consequently, in comparison with the prior art structures, delta-strained quantum well 31 of the present invention can be essentially viewed as comprising a narrow (a few mono-layers), highly strained semiconductor layer inserted into an unstrained or lightly strained quantum-well layer. The composition and strain of delta-strained layers 34 are engineered so that their HH energy level HH1 (see FIG. 3A) remains at substantially the same level as that found in the prior art device, i.e., at energy level HH1' (see FIG. 3B). However, the LH energy level LH1 (see FIG. 3A) is substantially modified for delta-strained layer 34 as compared to LH energy level LH1' of the prior art device (see FIG. 3B). Similar tensile delta-strained layers could be employed in a manner analogous to uniformly tensile strained wells.

In the compressive case, while the HH band of quantum well 31 is substantially unchanged with respect to quantum well 31', the LH band is pushed downward by adding the spike potential caused by adding delta-strained layer 34. This HH-LH splitting produced by the incorporation of strain has been shown to be a key parameter in the improved electronic properties of strained quantum-well lasers. Ahn and Chuang in their publication (cited above) use their theoretical model to explain these beneficial results in greater detail. Delta-strained layers, by enabling an improvement in HH-LH splitting without the use of excessive strain, will provide for improved laser performance. Similar beneficial results are achieved in tensile delta-strained layers.

A computer simulation performed for a typical implementation of laser 20 indicated that the spike potential introduced by delta-strained layer 34 caused an increase in the splitting of HH-LH subband by more than a factor of 2.5. The computer simulation also showed that conduction band energy level E1 can be made to line up with the corresponding energy level E1' of the prior art (see FIG. 3B). It has been further found that the increase of HH-LH splitting caused by introduction of delta-strained layer 34 decreases the HH effective mass, thereby resulting in a reduction of the non-radiative recombination, an improvement of the optical gain and differential gain, and, thus, an improvement in the laser performance. It is contemplated that the delta-strained quantum-well structure allows the achievement of effects similar to much higher strains in the order of three to seven percent without forming dislocations and while maintaining well width.

Obviously many modifications and variations of the present invention are possible in the light of the above teachings. For example, it will be evident to those skilled in these arts that the present invention may be implemented in both edge- and surface-emitting lasers. Of course, the invention may also be implemented in similarly constructed optical amplifiers as discussed above. In this regard, an optical amplifier is similar to the FIG. 1 laser 20 except that surfaces 40 and 41 are transparent so that there is no resonant cavity and the output radiation R at surface 40 would be an amplified version of radiation that was incident on surface 41. Therefore, it should be understood that the foregoing disclosure relates to only a preferred embodiment of the invention and that numerous modifications and alterations may be made therein without departing from the spirit and scope of the invention as set forth in the appended claims.

What is claimed is:

1. A quantum-well semiconductor device comprising:
   a highly doped N-region of semiconductor material;
   a highly doped P-region of semiconductor material; and
   at least one quantum-well heterostructure sandwiched between said N-region and said P-region, said quantum-well heterostructure including at least one quantum well having a delta-strained layer therein, the quantum well being sandwiched between at least two quantum barrier layers, wherein there is a lattice mismatch between said delta-strained layer and said quantum-well, and wherein conduction, heavy hole and valence band edges of said quantum-well remain substantially constant across the quantum well, and wherein a light hole band edge of said delta-strained layer is substantially lower than a light hole band edge of said quantum well.

2. The device of claim 1 wherein said quantum-well heterostructure is composed of intrinsic semiconductor material.

3. The device of claim 2 wherein said delta-strained layer is located substantially at the center of said quantum well.

4. The device of claim 3 wherein said quantum-well heterostructure includes a plurality of said quantum wells separated by barrier layers.

5. A quantum-well semiconductor device comprising:
   a highly conductive semiconductor substrate;
   a highly doped N-region of semiconductor material mounted on said substrate;

a quantum-well heterostructure having a first barrier layer, a delta strained quantum-well layer having a delta-strained layer disposed therein, and a second barrier layer successively joined to each other, wherein there is a lattice mismatch between said delta-strained layer and said quantum-well layer, wherein valance, heavy hole and conduction band edges of said quantum-well layer and said delta-strained layer are located at substantially the same level, and wherein a light hole band edge of said delta-strained layer is substantially lower than a light hole band edge of said quantum well layer;

a highly doped P-region of semiconductor material mounted on said quantum-well heterostructure; and a conductive contact joined to said P-region.

6. The device of claim 5 wherein said quantum-well heterostructure is composed of intrinsic semiconductor material.

7. The device of claim 6 wherein said delta-strained layer is composed of one to several mono-layers of intrinsic semiconductor material having a lattice structure that highly mismatches the lattice structure of said quantum-well layer.

8. A quantum-well semiconductor laser comprising:

a conductive semiconductor substrate;

a highly doped N-region of semiconductor material mounted on said substrate;

an active region including a quantum-well heterostructure forming a resonant laser cavity mounted on said N-region, said quantum-well heterostructure including a quantum-well layer having a delta-strained layer disposed therein and at least two barrier layers sandwiching said quantum-well layer, wherein there is a lattice mismatch between said delta-strained layer and said quantum-well layer, wherein valence, heavy hole and conduction band edges of said quantum-well layer and said delta-strained layer are located at substantially the same level, and wherein a light hole band edge of said delta-strained layer is substantially lower than a light hole band edge of said quantum well layer;

a highly doped P-region of semiconductor material mounted on said active region; and a conductive contact joined to said P-region.

9. The laser of claim 8 wherein said quantum-well heterostructure is composed of intrinsic semiconductor material.

10. The laser of claim 9 wherein said delta-strained layer is composed of one to several mono-layers of intrinsic semiconductor material having a lattice structure that highly mismatches the lattice structure of said quantum-well layer.

* * * * *